US008324510B2

(12) United States Patent
Cheung

(10) Patent No.: US 8,324,510 B2
(45) Date of Patent: Dec. 4, 2012

(54) OUT OF PLANE INTEGRAL CONDUCTIVE ARMS AND METHODS FOR MANUFACTURING THE SAME

(75) Inventor: Patrick C. P. Cheung, Castro Valley, CA (US)

(73) Assignee: Palo Alto Research Center Incorporated, Palo Alto ( * ) Notice: Subject to any disclaimer, the term of this patent is extended or adjusted under 35 U.S.C. 154(b) by 503 days.

(21) Appl. No.: 12/580,832

(22) Filed: Oct. 16, 2009

(65) Prior Publication Data

US 2011/0092083 A1 Apr. 21, 2011

(51) Int. Cl.
*H05K 1/11* (2006.01)
*H05K 3/00* (2006.01)
*H01R 9/00* (2006.01)

(52) U.S. Cl. ............................. 174/261; 174/267; 29/842

(58) Field of Classification Search .................. 174/261, 174/262–267; 361/792–795
See application file for complete search history.

(56) References Cited

U.S. PATENT DOCUMENTS

| 6,521,970 | B1 | 2/2003 | Takiar et al. | |
|---|---|---|---|---|
| 7,043,831 | B1 * | 5/2006 | Farnworth et al. | 29/852 |
| 2004/0087063 | A1 * | 5/2004 | Akhavin et al. | 438/127 |
| 2006/0151203 | A1 | 7/2006 | Krueger et al. | |
| 2006/0186540 | A1 | 8/2006 | Buchwalter et al. | |
| 2009/0046072 | A1 | 2/2009 | Emig et al. | |

OTHER PUBLICATIONS

U.S. Appl. No. 12/045,523, filed Mar. 10, 2008 in the name of Cheung.
Dang et al., "Sea-of-Leads MEMS I/O Interconnects for Low-k IC Packaging", Journal of Microelectromechanical Systems, vol. 15, No. 3, Jun. 2006, pp. 523-530.
Bakir et al., "Chip Integration of Sea of Leads Compliant I/O Interconnections for the Ultimate Enabling of Chips with Low-k Interlayer Dielectrics", 2004 Electronic Components and Technology Conference, pp. 1167-1173.
Bakir et al., "Sea of Leads Ultra High-Density Compliant Wafer-Level Packaging Technology, Georgia Institute of Technology", 2002.
U.S. Office Action mailed Aug. 10, 2009, for U.S. Appl. No. 12/045,523.

(Continued)

*Primary Examiner* — Jeremy Norris
(74) *Attorney, Agent, or Firm* — Oliff & Berridge, PLC

(57) ABSTRACT

A printed circuit board includes a multiple-layer electrical circuit board and a conductive arm, wherein the conductive arm has an unconnected end located opposite to the connected end of the conductive arm, wherein the conductive arm has a front side and a backside located opposite to the front side of the conductive arm, wherein the backside of the conductive arm is located adjacent to the multiple layer electrical circuit board. The unconnected end of the conductive arm includes a dimple portion formed integrally with and as a unitary part of a remaining portion of the conductive arm, the dimple portion being out of plane with in plane portions of the connected end of the conductive arm so that the dimple portion is at a greater distance from the circuit board than the in plane portions of the conductive arm, the dimple portion being connected to the in plane portions of the conductive arm via an integrally formed and unitary riser portion. An air gap is formed between the backside of the arm and the multiple layer electrical circuit board, wherein the air gap permits the arm to flex within the air gap. An ink jet component is laminated to the printed circuit board, wherein the dimple on the front side of the arm contacts a surface of the component, wherein a restoring spring force of the conductive arm maintains electrical contactivity between the dimple and the component.

21 Claims, 8 Drawing Sheets

OTHER PUBLICATIONS

U.S. Office Action mailed Jan. 8, 2010, for U.S. Appl. No. 12/045,523.

Notice of Allowance mailed Apr. 6, 2010, for U.S. Appl. No. 12/045,523.

* cited by examiner

OUT OF PLANE INTEGRAL CONDUCTIVE ARMS AND METHODS FOR MANUFACTURING THE SAME

BACKGROUND

Described herein are structures including conductive arms that include an integral out of plane dimple portion and methods for manufacturing the conductive structures through removal of a portion of an underlying sacrificial material. The structures and methods for manufacturing the structures may include an array of cantilever conductive arms to provide electrical contacts for a printed circuit board (hereinafter "PC board"). The conductive arms may be released from the PC board by removing a portion of a sacrificial underlying material between the conductive arm and the body of the PC board.

The conductive arms may be used in applications that may require substantially similar stringent electrical requirements such as required for a PC board within a solid ink printhead. For example, the cantilever conductive arms may be used in highly integrated sensing circuits or actuator driver electronics having to be mounted near a vibrating source.

REFERENCES

Co-pending U.S. patent application Ser. No. 12/045,523 filed Mar. 10, 2008, incorporated herein by reference in its entirety, describes a printed circuit board including a multiple layer electrical circuit board and a nickel arm, wherein the nickel arm has an unconnected end located opposite to the connected end of the nickel arm, wherein the nickel arm has a front side and a backside located opposite to the front side of the nickel arm, and wherein the backside of the nickel arm is located adjacent to the multiple layer electrical circuit board. A separate dimple is formed at the unconnected end of the nickel arm and on the front side of the nickel arm. An air gap is formed between the backside of the arm and the multiple layer electrical circuit board, wherein the air gap permits the arm to flex within the air gap. In this application, the dimple is formed separately from the nickel arm, that is, it is not unitary and integral with the nickel arm, and instead is adhered to the nickel arm. Between the top of the dimple to the bottom face of the arm is all solid, and therefore the amount of space underneath the arm must be greater than the amount of bending that will take place during assembly. If the bottom of arm at the unconnected end were to touch the PC board, the solid dimple will in turn apply pressure to the target object, and may potentially break the object.

Various PC boards providing several thousands of piezo elements with electrical interconnection contacts have been proposed for high density and wide format solid ink printheads. These various PC boards have provided improvements in electrical interconnection contacts for the piezo elements of the PC boards in solid ink printheads. However, as high density and wide format solid ink printheads and PC boards are manufactured at lengths greater than about 8 inches, a density of the piezo elements on the PC boards must be increased simultaneously to improve performance and extend media latitude or size range.

The piezo elements on PC boards require electrical interconnection contacts to provide electrical contacts for the PC boards within the solid ink printheads. The various PC boards provide electrical interconnection contacts made with silver epoxy droplets or conductive silicone adhesive droplets. Without having an electrical interconnection contact provided by the droplets, the piezo elements connected to those droplets are inoperable. The silver epoxy or conductive silicone adhesive droplets are applied to the PC board by screen printing the droplets through a stainless steel stencil. When solidified, the droplets will provide electrical interconnection contacts for the PC boards within the solid ink printhead. Silver epoxy and conductive silicon adhesive droplets are increasingly susceptible to developing hairline cracks and failing as electrical interconnection contacts when smaller sized droplets are required to be used on PC boards.

An increased density of piezo elements on PC boards requires use of smaller sized droplets for each piezo element to prevent overlap of or contact between more than one droplet. Overlap of or contact between more than one droplet causes the droplets to pass electrical signal to the wrong piezo elements.

Additionally, thousands of thermal cycles performed by the solid ink printhead may damage or destroy the droplets of the piezo elements because the small sized droplets are not resistant to thermal damage caused by each thermal cycle through the developing of hairline cracks. Damaged or destroyed droplets fail to provide electrical interconnection contacts for the piezo elements associated with the damaged or destroyed droplets. As a result, these piezo elements are inoperable.

Failure of as few as one piezo element on a PC board may cause a white line or non-printed area to appear on every page of paper printed thereafter by the solid ink printhead. Thus, failure of one or more piezo elements and/or one or more dimples and/or one or more silver epoxy or conductive silicone adhesive droplets causes the PC board and solid ink printhead to be inoperable and unusable as a PC board or in a printhead.

While current PC boards including piezo elements with electrical interconnection contacts made of silver epoxy or conductive silicone adhesive droplets are acceptable for their intended purposes within solid ink printheads, it is still desired to provide PC boards with improved interconnection structures for electrical interconnect contacting to improve production yield and end product quality.

SUMMARY

PC boards having conductive arms provide electrical interconnect contacts, for example for piezo elements, having improved resistance to breaking, thermal damage and failure. Such improved PC boards with releasable conductive arms address one or more of the above issues to provide PC boards resistant to electrical interconnect contact failures and that are resilient.

In embodiments, described is a structure including a circuit board having at least one conductive arm, wherein the conductive arm has an unconnected end located opposite to a connected end of the conductive arm that is connected to the circuit board, wherein the conductive arm has a front side and a back side located opposite to the front side of the conductive arm, wherein the backside of the conductive arm is located adjacent to the circuit board, and wherein the unconnected end of the conductive arm includes a dimple portion formed integrally with and as a unitary part of a remaining portion of the conductive arm, the dimple portion being out of plane with in plane portions of the connected end of the conductive arm so that the dimple portion is at a greater distance from the circuit board than the in plane portions of the conductive arm, the dimple portion being connected to the in plane portions of the conductive arm via an integrally formed and unitary riser portion, and an air gap formed between the back side of the conductive arm at least at the dimple portion and the circuit board, permitting the conductive arm to flex into the space of the air gap.

Also described is a structure including (A) a printed circuit board including (1) a multiple layer electrical circuit board having at least one conductive arm, wherein the conductive arm has an unconnected end located opposite to a connected end of the conductive arm that is connected to the multiple layer electrical circuit board, wherein the conductive arm has a front side and a back side located opposite to the front side of the conductive arm, wherein the backside of the conductive arm is located adjacent to the multiple layer electrical circuit board, and wherein the unconnected end of the conductive arm includes a dimple portion formed integrally with and as a unitary part of a remaining portion of the conductive arm, wherein prior to connection to an ink jet printhead component, the dimple portion is out of plane with in plane portions of the connected end of the conductive arm so that the dimple portion is at a greater distance from the circuit board than the in plane portions of the conductive air, the dimple portion being connected to the in plane portions of the conductive arm via an integrally formed and unitary riser portion, and (2) an air gap formed between the back side of the conductive arm at least at the dimple portion and the multiple layer electrical circuit board, permitting the conductive arm to flex into the space of the air gap; and (B) an ink jet printhead component laminated to the printed circuit board, wherein following connection of the printed circuit board to the ink jet printhead component, the dimple portion contacts the component, the conductive arm is flexed into the air gap, and a restoring spring force is exerted by the conductive arm to maintain electrical contactivity between the dimple portion and the component.

In further embodiments, described is a method comprising forming a circuit board having at least one conductive arm, wherein the conductive arm has an unconnected end located opposite to a connected end of the conductive arm that is connected to the circuit board, wherein the conductive arm has a front side and a back side located opposite to the front side of the conductive arm, wherein the back side of the conductive arm is located adjacent to the circuit board, and wherein the unconnected end of the conductive arm includes a dimple portion formed integrally with and as a unitary part of a remaining portion of the conductive arm, the dimple portion being out of plane with in plane portions of the connected end of the conductive arm so that the dimple portion is at a greater distance from the circuit board than the in plane portions of the conductive arm, the dimple portion being connected to the in plane portions of the conductive arm via an integrally formed and unitary riser portion, and an air gap formed between the back side of the conductive arm at least at the dimple portion and the circuit board, permitting the conductive arm to flex into the space of the air gap, the forming comprising (A) on a circuit board substrate, forming a sacrificial underlying layer including a bump of greater thickness than other portions of the sacrificial underlying layer, wherein the bump is located on the circuit board substrate where the dimple portion of the arm will be formed; (B) forming a via through the circuit board substrate; (C) patterning a resist onto portions of the sacrificial underlying layer not to have conductive plated thereon, the resist covering a portion of the bump; (D) plating a conductive layer onto the exposed portions of the sacrificial underlying layer and into the via; (E) removing the resist following the plating of the conductive layer; and (F) etching to remove at least a portion of the sacrificial underlying material located between the plated conductive layer and the circuit board substrate to form the unconnected end of the conductive arm and the air gap between the back side of the conductive arm and the circuit board substrate.

EMBODIMENTS

Described herein is a structure that includes at least a circuit board having at least one conductive arm. The conductive arm has an unconnected end located opposite to a connected end of the conductive arm, the connected end being connected to the circuit board. The conductive arm has a front side and a back side located opposite to the front side of the conductive arm, wherein the backside of the conductive arm is located adjacent to the circuit board. The unconnected end of the conductive arm includes a dimple portion formed integrally with and as a unitary part of a remaining portion of the conductive arm, the dimple portion being out of plane (at least in an unflexed or undeflected state prior to connection of the circuit board to another component) with at least a portion of the connected end of the conductive arm so that the dimple portion is at a greater distance from the circuit board than in plane portions of the conductive arm. The dimple portion is integrally connected to the in plane portions of the conductive arm via a unitary riser portion. An air gap is formed between the back side of the conductive arm at least at the dimple portion thereof and the circuit board, permitting the conductive arm to flex, or deflect/bend, into the space of the air gap.

The conductive arm may be comprised of any material suitable for use in forming an interconnect electrical connection. In embodiments, the conductive arm is comprised of nickel. The nickel may be a substantially pure nickel, or it may be a nickel alloy. A conductive material that also has excellent thermal properties is desired, as such may withstand any elevated process temperatures during formation of the arm and during subsequent formation of laminated structures.

Figure 1:
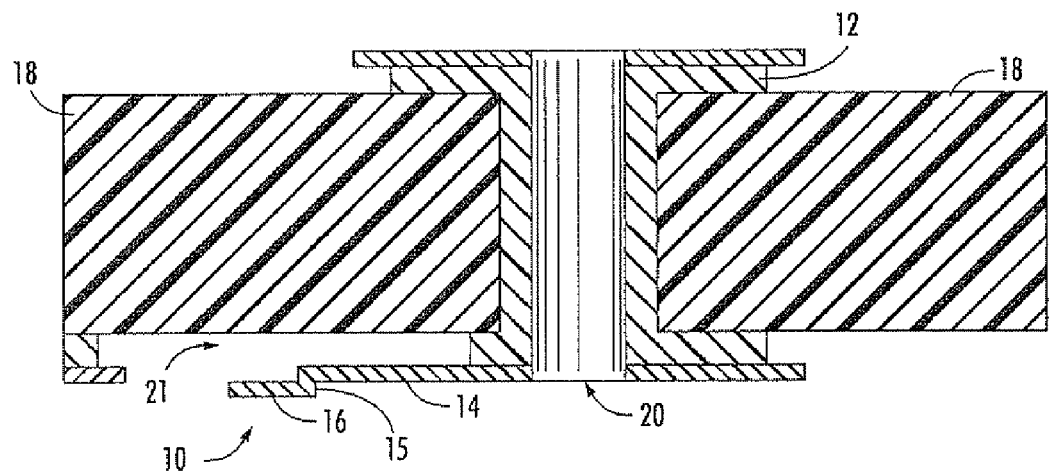
FIG. 1 illustrates a cross-sectional view of a simplified circuit board having a conductive arm with an integral riser portion and out of plane dimple portion.

A simplified structure 10 is illustrated in FIG. 1. In FIG. 1, structure 10 includes a circuit board 18. The circuit board may be any type of circuit board, including a single layer board material such as FR4 (a fiber reinforced epoxy fabric-like material), a multiple layer electrical circuit board, a printed circuit board and the like. With respect to a conductive arm, the circuit board includes a via or metal insert (shown as 20 in FIG. 1) that acts as an anchor, for example in conjunction with surrounding portion anchor 19 (see FIG. 7), which may be comprised of nickel over copper, and as an electrical connection path for the conductive arm 14. An underlying layer 12, comprised, for example, of copper, is upon the circuit board 18, and acts as a supporting metal and binder for conductive. The portions of layer 12 shown in FIG. 1 are left following etching of this material, as detailed more fully below. Conductive portions are deposited upon the layer 12, and include at least one cantilever conductive arm 14. As can be seen in FIG. 1, the conductive portions extend to both sides of the board 18 through the via or metal insert 20, and thus act to anchor the conductive arm 14. FIG. 1 illustrates one conductive arm 14 as part of these conductive portions.

The conductive arm is thus connected at one end to the circuit board 18, for example with the via or metal insert 20. The opposite end from the connected end of arm 14 is an unconnected end of the arm. The term "unconnected" refers to the end of the arm, which includes dimple portion 16, having its back side detached from the circuit board 18, due to etch removal of the underlying layer 12 from the area between the unconnected end of the arm 14 and the circuit board 18. The unconnected end of the arm 14 is thus free to be able to flex or bend into the air gap 21 between the unconnected end of the arm 14 and the circuit board 18. The unconnected end of the arm is, however, unitarily and integrally connected to the connected end of the arm via riser portion 15.

Figure 7:
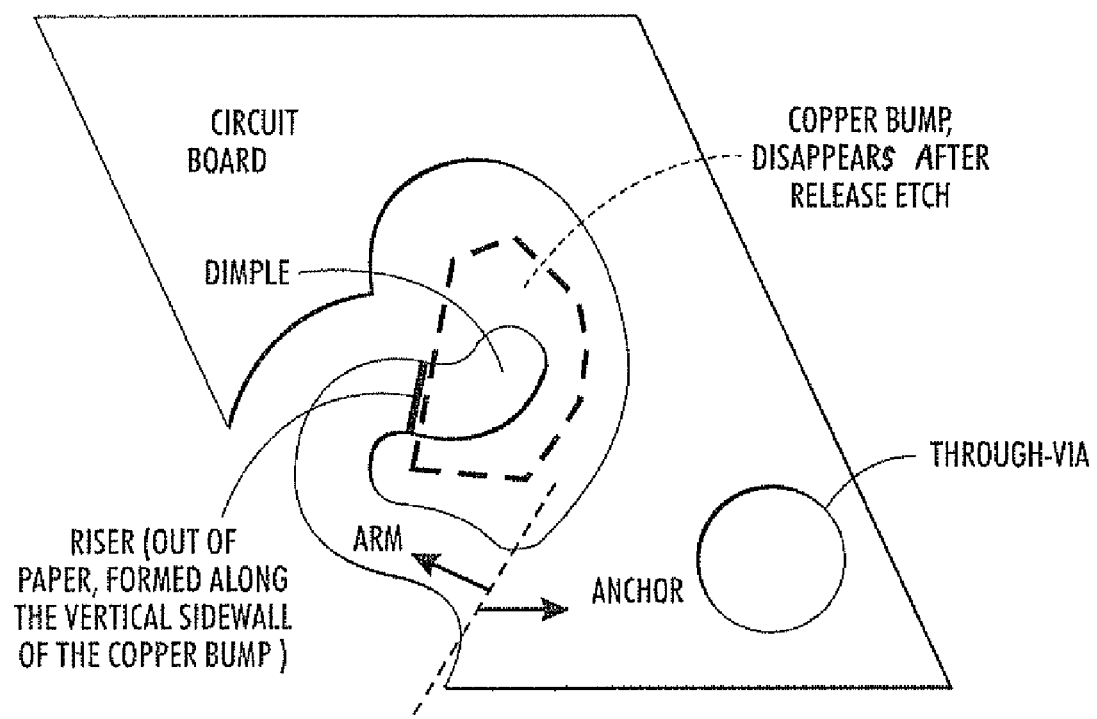
FIG. 7 is a top view of an arm interconnect unit.

Although not part of the arm, the anchor (for example, 19 as shown in FIG. 7) to the arm is a structure that should be included to ensure proper functioning of the arm. The connected part of the arm is connected to the anchor. An anchor primarily includes two flat layers of material. The top material is desirably the same structural material that forms the arm. This structural material binds to the circuit board by means of the second material layer, which is desirably the same sacrificial material found underneath the arm, but the material stays under the anchor because it is not readily exposed to the chemical etchant that has etched away the sacrificial material.

Additionally, in many embodiments, the anchor also includes a through via 20 or blind via, where the two layers develop a more complicated geometry partly to make electrical conduction to signals from various layers of the circuit board, and partly to form intricate 3D structures that imbed the rest of the anchor to the circuit board.

The unconnected end of the arm includes a dimple portion 16. Dimple portion 16 is integral and unitary with the riser portion 15 and the remaining portions of conductive arm 14. In other words, dimple portion 16 is formed of the same material (conductive) and at the same time as the rest of the conductive arm 14 (including riser portion 15) so that arm 14 and the dimple portion thereof, as well as riser portion 15, are a single piece of the same material. As a result, there is no separate material that must be adhered to the conductive arm 14 in order to form a dimple thereon.

As seen in FIG. 1, dimple portion 16 is out of plane with the connected end of the arm 14. In other words, dimple portion 16 and the connected end of the arm 14 are stepped with respect to each other in an undeflected state of the arm, via riser portion 15, the dimple portion being a greater distance from the circuit board surface than the connected end of the arm. For example, a distance between the connected end of the arm and the circuit board surface may be from about 4 to about 25 microns, and the distance between the dimple portion and the circuit board surface may be from about 15 to about 40 microns. In the undeflected state, the difference in the distance from the circuit board surface to the connected end of the arm and the distance from the circuit board surface to the dimple portion is set by the riser portion. The riser portion thus defines how far away the dimple portion is from the in plane portions.

In embodiments, a cylindrical metal insert 20 as shown in FIGS. 1-4 may be used to connect each layer in the circuit board. In further embodiments, holes or vias may be used. Rather than passing through the entire board as with the cylindrical metal insert, the holes or vias do not pass through the entire circuit board and only connect some of the copper layers. Holes or vias are called "blind vias" when they connect, for example, an internal copper layer to an external copper layer.

The arm 14 may have a length defined between a connected end and an unconnected end located opposite to the connected end of the arm 14. In embodiments, the connected end of the arm 14 may be adjacent to and/or connected to the via or metal insert 20 of the circuit board. In further embodiments, the connected end of the arm 14 may be adjacent to and/or connect to a remaining portion of the underlying sacrificial material 12 that also assists in binding the arm 14 to the circuit board. The arm 14 may have a thickness such as from about 5 microns to about 15 microns.

The arm 14 has a front side and a back side located opposite to the front side of the arm 14. The back side of the arm 14 is adjacent to or facing the circuit board 18. The front side of the arm 14 faces outwardly with respect to the body of the circuit board. The dimple portion 16, as discussed above, is further away from the circuit board than the front side of the connected end of the arm 14, as a result of the riser portion 15. The dimple portion 16 also has a front side and a back side.

An air gap 21 is located between (a) the back side of the arm 14 and dimple portion 16 and (b) the circuit board 18. The air gap 21 has a thickness defined by the distance between the surface of the circuit board and the back sides of the connected end of the arm 14 and the dimple portion 16 of the arm 14. The air gap is a completely empty space to permit flexing of the arm into the air gap without contact with either the surface of the circuit board or any structure between the arm and the surface of the circuit board. As a result of the air gap, the unconnected end of the arm 14 is mechanically decoupled and separated from the circuit board as shown in FIG. 1 and discussed above.

Figure 2:
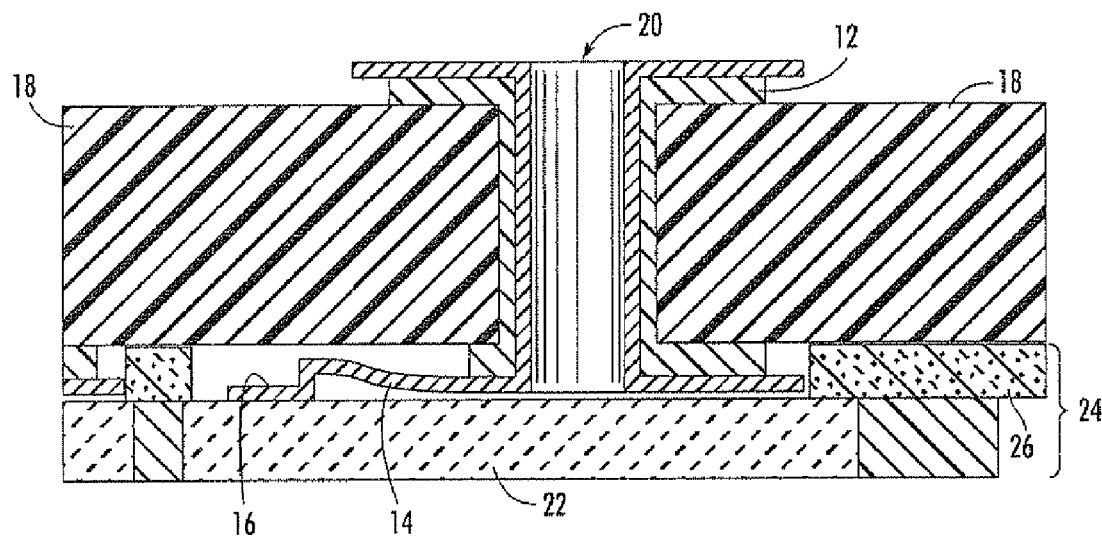
FIG. 2 illustrates a cross-sectional view of the circuit board of FIG. 1 having a conductive arm with an integral riser portion and dimple portion after lamination to another element.

The structure 10 may be connected to an ink jetting component 22 as shown in FIG. 2. The ink jetting component 22 may include one or more of a jetstack, a piezo jetting element, a diaphragm and the like. The jetstack is a composite assembly that has pieces of PZT (lead zirconium titanate) on the top surface that is to be mated to the circuit board. Underneath the PZT array are about 5 to about 25 sheets of patterned stainless steel and/or adhesive layers all finely etched and bonded together. The assembly of a circuit board with ink jet components is well known in the art, and thus further details of the ink jet components is unnecessary here.

As shown in FIG. 2, when the structure 10 of FIG. 1 is connected to component 22, for example by way of adhesive 26, the front side of the protruding or bumped out dimple portion contacts the component 22 and forms an electrical connection therewith. As a result of the contact, the dimple portion 16 deflects/flexes to be pushed back toward the circuit board 18 surface, which in turn causes the arm 14 to flex back into the air gap 21 as shown in FIG. 2. Even with the flexing into the air gap space as shown in FIG. 2, the dimple portion at the unconnected end of the arm still does not contact the circuit board 18. The air gap thus must be large enough that the dimple portion and awl can flex or deflect back into the air gap when making a connection without contacting the circuit board 18.

As a result of the foregoing design, the arm itself is able to provide a stable and reliable electrical connection with the component 22. The flexing of the arm when connected to a component results in the arm being bent as shown in FIG. 2, which causes the arm to exert a restoring spring force forward toward the component 22. That is, when connected such that the dimple portion of the arm is bent into the air gap, the arm 14 seeks to bend or flex to its original state, thus providing a force against component 22 sufficient to form a stable and reliable electrical connection therewith, and without the need for any solder component in the connection. Of course, if it is desired to even further strengthen the connection, a solder may be included at the point of connection.

The unconnected end of the arm 14 may be compressed inwardly with respect to the circuit board 18 by a distance of about 5 microns to about 15 microns. In embodiments, the restoring spring force of the arm 14 that may be exerted against the component 22 may be about 1 gram force to about 2 gram force. The restoring spring force of the arm 14 that maintains electrical continuity and contactivity between the arm 14 and the component 22 may be substantially similar to restoring spring force utilized in, for example, a land grid array (hereinafter "LGA") used on microprocessors having a Socket F with 1207 Pins. For example, the restoring spring force of the arm 14 may be equal to or substantially equal to the restoring spring force in a LGA array of heat treated/stamped BeCu springs plated with a layer of gold having a thickness of about 0.76 microns.

The restoring spring force, achieved due to the spacing between the arm and the board, differentiates the conductive arm structures herein from structures where the arm is minimally spaced from the board, for example by a distance of only 2 microns merely for electrical separation purposes. Such a small separation does not allow for flexing, and does not provide the restoring spring force to maintain a contact with integrity. In fact, during assembly, the solder that makes up the dimple softens so the arm does not even flex into the 2 micron space at all. This is why prior arm designs with minimal spacing of, for example, only 2 microns require the use of a solder for maintenance of the connection.

Figure 3:
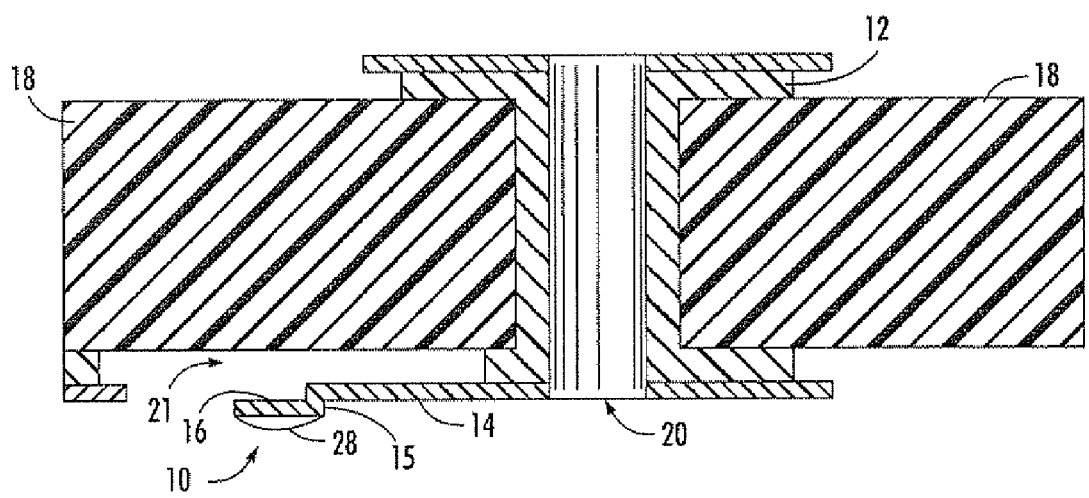
FIG. 3 illustrates a cross-sectional view of the circuit board of FIG. 1 having a conductive arm with an integral riser portion and dimple portion, and with a thin layer of contacting material added to a front face of the dimple portion.

In embodiments, the structure 10 may have a contact material 28 at a contact point where the dimple portion 16 contacts a functional layer, such as component 22. Inclusion of a contact material 28 on a front side surface of the dimple portion 16 is shown in FIG. 3. The contact material 28 may alternatively be located on the functional layer at the contact points with the dimple portion 16. The contact material 28 may improve electrical contactivity properties between the arm 14 and the component 22, and may be useful in increasing the overall height of the dimple portion. In embodiments, the contact material 28 may be a metal epoxy such as a silver epoxy, tin, lead, a tin-lead mixture, or mixtures thereof. The contact material 28 is not a solder. A suitable contact material may be TATSUTA AE3030, a silver epoxy that has a high glass transition temperature.

The contact material 28 may be applied to the dimple portion 16 before the circuit board is connected to the component 22. The contact material 28 may be applied to the dimple portion 16 by, for example, wetting and the like. In embodiments, the contact material 28 may be applied to the dimple portion by first forming a pattern of contact material 28 on an intermediate board, for example a transparent board such as a Plexiglas board. A stencil, such as photo-chemically defined stainless steel stencil, may be used to form the contact material pattern on the intermediate substrate. The intermediate board is then aligned and brought into contact with the dimple portion(s) to transfer the contact material to the front side of the dimple portions as shown in FIG. 3. The contact material may be applied to the dimple portion so as to have a thickness of about 4 microns to about 15 microns. Additional transfer steps can be applied to increase the height of the contact material even further, although uniformity of the dimple height across an array may be harder to maintain.

The contact material 28 desirably only wets a top of the dimple 16 at the unconnected end of the arm 14 without wetting any other area of the arm 14. If excessive contact material is applied, the contact material may bridge across from the dimple portion 16 to other portions of the arm 14 and/or to the body of the circuit board. As a result, the arm 14 may be inoperable because the restoring spring force is hampered by the excessive contact material, and the arm cannot move laterally or flex towards the circuit board.

The contact material 28 may have sufficient interaction so that the electrical contactivity is improved between the arm 14 and the component 22. As a result, the contact material 28 assists in preventing breakage, termination of the electrical contactivity or oxidation between the arm 14 and the component 22. The contact material 28 may increase or improve contactivity properties between the dimple portion 16 of the arm 14 and the component 22.

Note that after the assembly, the contact material 28 desirably should not contribute to any additional thickness being built up because the contact material may undergo reflow so that some protruding part of dimple portion 16 still make physical contact directly with component 22.

Figure 4:
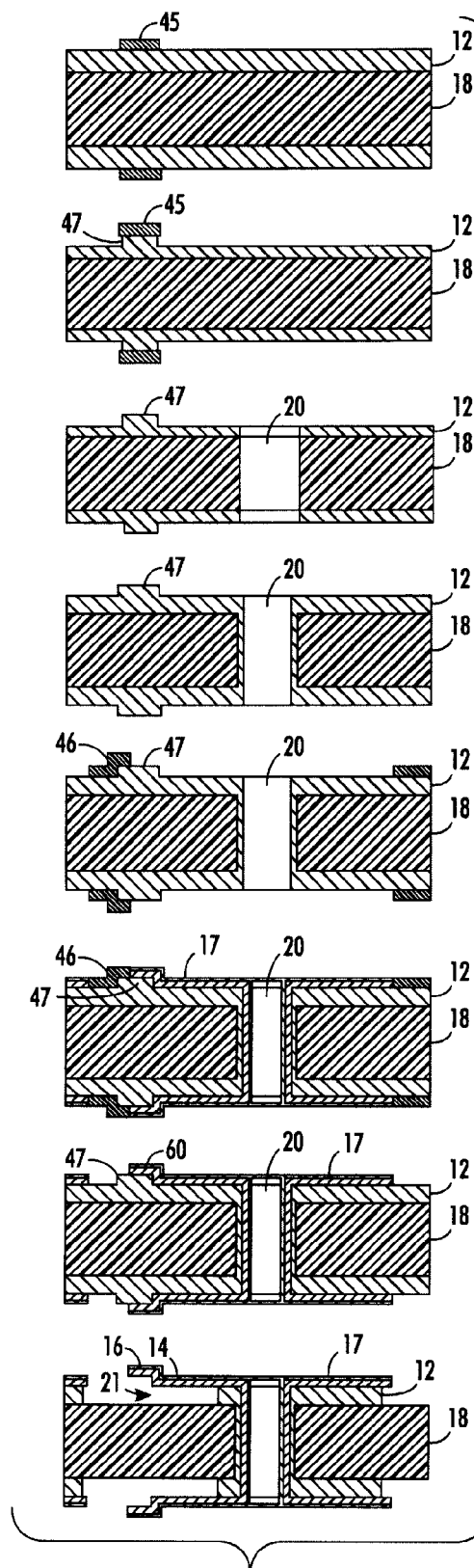
FIG. 4 illustrates an example process flow diagram for making a circuit board having at least one conductive arm with an integral riser portion and dimple portion.

An example process for making a structure having the conductive arm is illustrated in FIG. 4. The process utilizes a copper bump in an underlying sacrificial layer to form the dimple portion of the conductive arm. The process starts on a substrate or circuit board 18 with a layer of sacrificial material 12 on one or both surfaces thereof. The sacrificial layer may be any material capable of later etching. Desirably, the sacrificial layer is comprised of copper. In the illustrated case, sacrificial layer 12 is on both surfaces of circuit board 18. Also in the illustrated case, the substrate may be a high-temperature version of FR4, a flame-retarded fiber-glass-epoxy-resin composite, and the sacrificial material may be copper.

In a first illustrated step, a resist 45 is patterned onto portions of the surface of the sacrificial layer 12 where the dimple portions of the arm will ultimately be located. Any suitable resist material may be used, for example including RISTON® dry film photoresists available from DuPont. In a second step, a timed immersion of the panel in an etchant for the sacrificial material will remove exposed portions of the sacrificial layers to reduce the thickness of the layers, forming two distinct levels in the sacrificial layers. An etchant for copper may be, for example, citric acid or TRANSENE 49-1 (from the Transene Company, Inc.). Other common copper etchants that may be used include ferric chloride and ammonium persulfate. Following the timed etching and removal of the resist, bump 47 in the sacrificial layers 12 remains. The bump itself is the sacrificial material and may have a height of from about 15 to about 40 microns. The resulting dimple portion of the arm thus has a corresponding height from the remaining in plane portions of the arm, and thus the riser portion thus has a length, of from about 15 to about 40 microns.

A through via 20 may then be drilled in the circuit board 18. The next step is an optional step of plating up additional sacrificial material, for example for an additional thickness of about 10 to about 15 microns, which may be achieved by any suitable method such as electroplating. Since the plate-up takes place everywhere at the same rate, this plate up does not substantially change the step height of the bumps but may widen them somewhat.

In a next step, another layer of resist is located on portions of both the top and bottom faces of the sacrificial layer 12 to define the length of the arms. These resist portions 46 are located upon an edge portion of the bump 47. Conductive metal nickel 60 for the arms 14 may then be deposited onto the surface of the sacrificial layers 12, for example by electroplating. The conductive material may be deposited to a thickness of about 5 to about 15 microns. As can be seen in FIG. 4, the conductive material plates not only upon the surfaces of the sacrificial layers on front and back surfaces of the board 18, but also on surfaces of the via 20, thereby connecting through the via. Such results in an anchoring of the conductive arm. Following deposition of the conductive material, an optional protective material 17 may be deposited on the conductive material, for example using gold as the protective material and deposited on the conductive material by any suitable process, for example immersion. At this stage, the arm has been properly formed. The gap between the arm portion to the board is 4 to 25 microns; the gap between the dimple portion to board is 15 to 40 microns.

After the resist material is stripped off, the board undergoes an etch release step to remove portions of the sacrificial layers 12 under the dimple portions 16 and conductive arms 14 in order to release the arms from the board 18. The etch release may be conducted by submerging the board in a solution of sacrificial material etchant, such as TRANSENE 49-1, agitated at between about 40 to about 50° C. Etch indicators may be used to determine the proper time to stop the etch release process. When using TRANSENE 49-1 as the etchant, it may take from two to three hours to completely release the arms; however, its selectivity towards nickel and gold is very favorable. When completed, the arms 14 will be free to bend up and down, and the out-of-plane dimple portions 16 will be at the unconnected ends of the arms 14. Air gap 21 is formed where the sacrificial layer material was located prior to the etch release. The etch release is able to selectively etch the sacrificial layer from beneath the arms under dimple potion 16 because at these locations, the arm is long and slender so the etchant is able to access and work quickly at these locations, whereas under the other portions of the conductive material, the conductive material is a larger area patch that the etchant cannot access as readily.

The size of dimple portion is limited by how small the copper bumps can be formed, and as well by how well alignment can be performed to image the dimple structure onto a small bump. In the design and fabrication, it is always advantageous to strive for making arms with a width equal to the smallest feature size available for that process because it will take the shortest amount of time to etch release these arms. When the amount of time the arms immersed in the etchant solution is minimized, more sacrificial material remains in the anchor regions and in turn binds the anchor to the circuit board.

The sacrificial underlying material between the arm 14 and the board 18 thus may be partially removed via chemical etching to release and separate the arm 14 from the body of the board. That is, the sacrificial underlying material underneath the arm 14 is removed in an amount necessary for the back side and/or unconnected end of the arm 14 to be decoupled or released from the board 18. In embodiments, the connected end of the arm 14 may remain connected to the remaining underlying sacrificial material. In further embodiments, the connected end of the arm 14 may remain connected to the cylindrical metal insert 20. By removing a portion of the sacrificial underlying material from the back side of the arm 14 and the board 18, the air gap 21 may be formed between the back side of the arm 14 and the board 18. As a result, the back side of the arm 14 does not contact the board 18. However, the chemical etching should be stopped once the portion of the underlying sacrificial material between the arm 14 and the body of the board is removed so remaining underlying sacrificial material is not corroded. If the underlying sacrificial material is not adequately removed, the remnants can interfere with the bending of the arm 14. However, the arm 14 is desirably not removable via the chemical etching, and remains following the etching.

Figure 5:
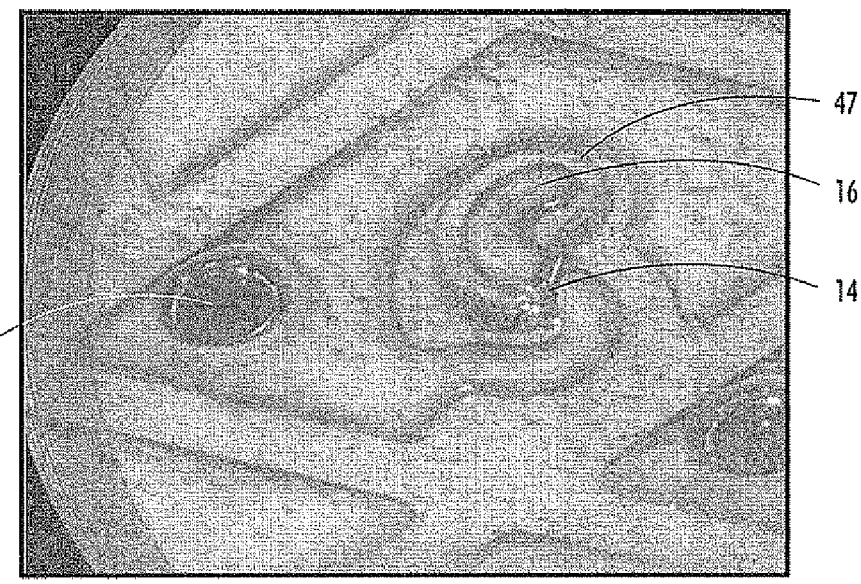
FIG. 5 is a picture of a structure in which the portion that will become the dimple portion of the conductive arm is formed upon a copper bump prior to etching of the copper bump.
Figure 6:
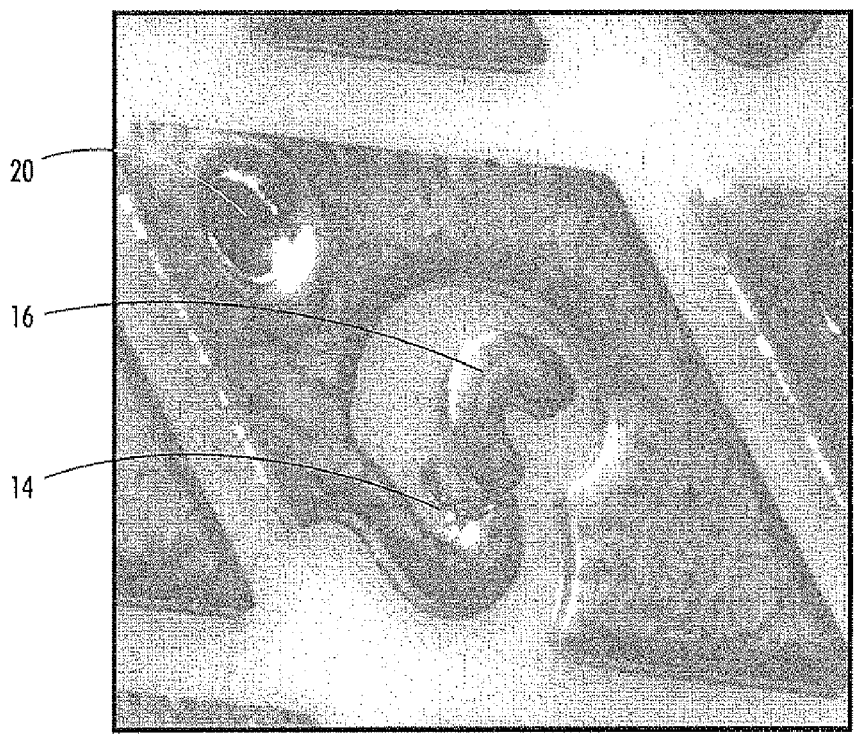
FIG. 6 is a picture of the structure in FIG. 5 following etching of the sacrificial copper bump.

FIG. 5 is a photograph of the structure after deposition of nickel to form the arm 14 and dimple portion 16, but prior to etch removal of the underlying copper sacrificial bump 47. FIG. 6 is a photograph of the same structure following etch removal of the underlying sacrificial layer to release the arm 14 and dimple portion 16. FIG. 6 illustrates that after the portion of the sacrificial underlying material is removed from the arm 14, the arm 14 forms a cantilevered springy component. The arm 14 may exhibit spring-like characteristics such that the arm 14 may bounce up and down and move, for example for from about 5 microns to about 15 microns, without deformation or destruction when contacted by a probe needle.

In the method for manufacturing the structures herein, the board and the arm 14 may be exposed to the chemical etchant for a period of time of, for example, about one to three hours, so that the portion of the sacrificial underlying material in the region where air gap 21 will be is etched away to form the air gap 21. If the body of the PC board and the arm 14 are over-exposed to the chemical etchant, for example about one week, the arm 14 may be fully separated from the PC board and may flow away into a solution that contains the chemical etchant.

After a portion of the sacrificial underlying material is removed from the body of the circuit board and the arm 14 is formed, the functional layers/components may be laminated.

The structure 10 may be used in conjunction with a component 22 and the adhesive material 26 to form an array 24 as shown in FIG. 2. In embodiments, the adhesive material 26 is located on the anchor regions, and may attach or secure the component 22 to the board 18. In embodiments, the adhesive material 26 may be, for example, acrylic film adhesive, RF-1500 available from Rogers Corporation, and the like.

Multiple structures 10 may be included in a structure array (not shown, although portions of adjacent structures 10 may be seen in FIG. 6). Each structure 10 in the array may have a configuration as shown in FIG. 6. The conductive arms may be configured to have a spiral or circular shape as shown in FIGS. 5 and 6.

The configuration of the structure 10 may be sufficiently electronically designed with a 2-dimensional drafting application, such as AUTOCAD LT, to produce an electronic design for the configuration of the structure 10. In embodiments, the electronic design may be converted to, for example GERBER data which is used by the PC board manufacturers. As a result, the electronic design may be integrated into full feature schematic and layout applications, such as CADENCE.

A board or array with conductive arm structures thereon may be referred to as an interposer board. In embodiments, an interposer board may contain, for example, several hundreds, several thousands or several tens of thousands of the conductive arm structures. The interposer board may vary in length, for example from about 4 inches to about 18 inches. The interposer board may be insertable between a known product stackboard and a known printhead jetstack. An example process flow is illustrated in FIG. 8.

Figure 8:
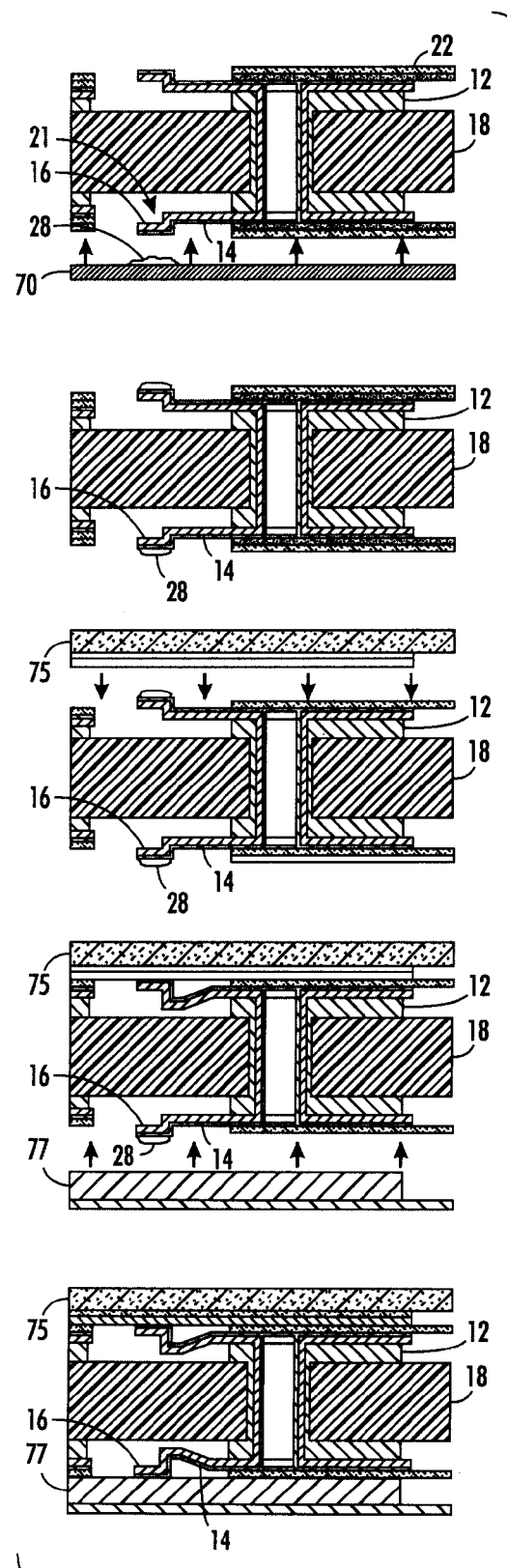
FIG. 8 is a process flow diagram for utilizing the FIG. 1 circuit board as an interposer board between a stack board and a jetstack of an ink jet printer.

After the interposer board is formed, the interposer board may be connected to adhesive films 22 as shown in FIG. 8. In embodiments, the interposer board may be heat-tacked with the adhesive films. In embodiments, the adhesive films may be translucent and/or laser-defined adhesive films. The adhesive films include open portions around the conductive arm structures so as not to interfere with any electrical connection. The adhesive films may include an outer liner that is later removed prior to adhesion to subsequent components.

As a first step in FIG. 8, after addition of the adhesive film, contact material 28 is added to the front side of the dimple portion 16 as described above. Plexiglas sheet 70 is used to transfer the contact material 28 to the dimple portions 16.

The interposer board is then adhered to the stackboard 75 (for example, an electronic circuit board) on one side and the jetstack 77 on the other side. Any liner 39 for the adhesive film 22 is removed prior to the lamination to join the interposer board between a known product stackboard and a known printhead jetstack. In embodiments, the interposer board may be laminated to the components in a hot press. In the final configuration, the interposer board and its releasable arms stay in the gap otherwise occupied by a big disc of silver epoxy. The lamination process is where the arms are pushed backward to set up the spring restoring force necessary for maintaining electrical contacts.

Liner 39 may also serve to protect the arm 14 before and during the application of the contact material, because as shown in FIG. 8, the liner may desirably extend to or above the height of the dimple portion such that the dimple portion is protected from bending unnecessarily prior to application of any contact material. The line can then be removed, as discussed above, so that the dimple portion then extends above the remaining structure such that it is bent upon lamination with another structure, as discussed above.

Figure 9:
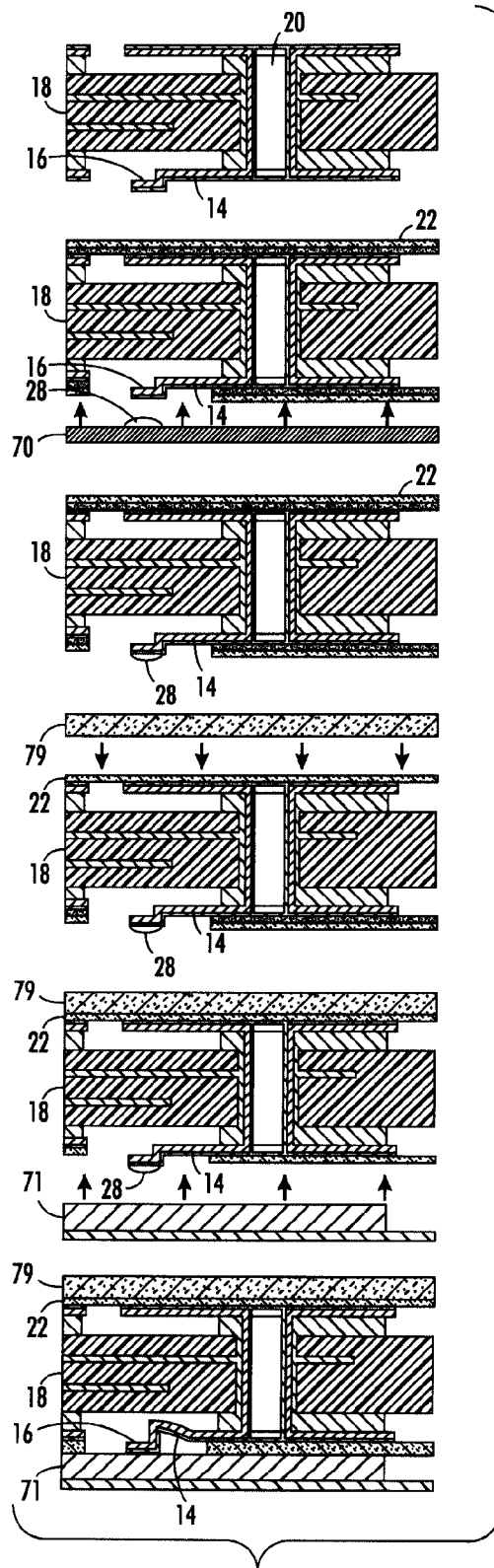
FIG. 9 is a process flow diagram illustrating a two stage etch of a copper sacrificial layer.

A similar process is illustrated in the process flow diagram of FIG. 9. In this process, a conductive arm structure is formed on one side of the structure. In this process, board 18 is a multi-layer electronic circuit board. The structure may include an integrated stackboard, and an ink jet manifold 79 is adhesively attached to the side of the board 18 opposite the conductive arm 14 with dimple portion 16 and contact material 28. A piezo element, diaphragm and jetstack 71 may be adhesively connected to the board 18 on the side of the conductive arms 14, thereby forming the electrical connection. An ink jet head configuration is achieved.

Figure 10:
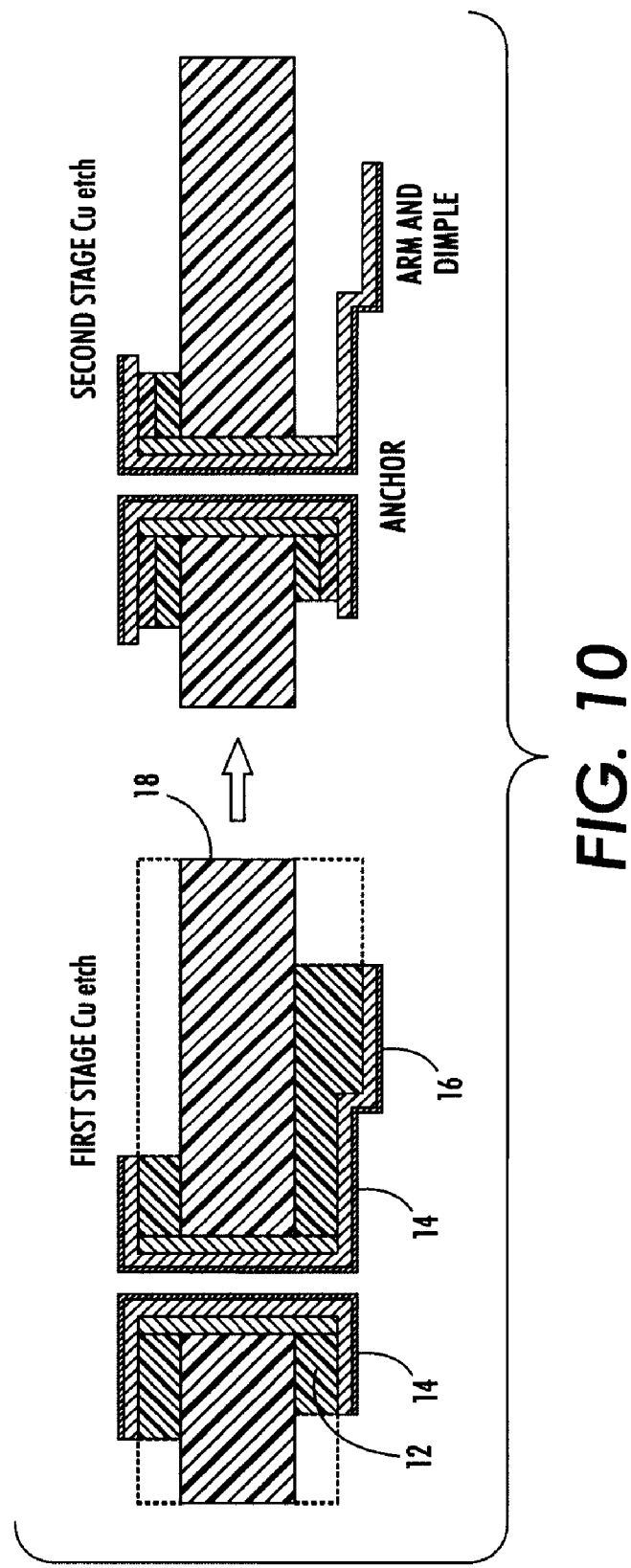
FIG. 10 is a process flow diagram for utilizing a circuit board having a conductive arm with an integral riser portion and dimple portion, and connected to a stack board (not shown) between an ink manifold and a piezo element, diaphragm and jetstack of an ink jet printer.

In embodiments, the etch release is conducted in at least two stages, allowing the integrity of the structure to be determined prior to final etch. A step towards the end of fabricating a useful final board, particularly a multi-layer board, is a set of open and short tests. This set of tests, which are well known in the circuit art, may be used to verify that none of the thousands of traces specified by the circuit schematic are open, and also to verify that none of the traces short to neighboring traces. The tests are often done in an automated process. Since this automated step is usually conducted at the panel level by robotic probes, the electrodes where the arms are formed have to be electrically isolated from one another at the stage of testing. A two-stage etch of the sacrificial material, such as shown in FIG. 10, allows for testing earlier in the process.

In a first stage of the etch, the sacrificial material between electrodes (dotted region in the left half of FIG. 10) is etched with the etchant. Following this first stage etch, one can proceed with the required open test and/or short test. Boards passing the test(s) may then be subjected to the final stage etch to release the arms 14 as shown in the right half of FIG. 10. The dotted circles in right half of FIG. 10 point to patches of sacrificial material that will stay even after final etch because the larger areas of plated conductive protect these portions from the etchant. These remaining patches of sacrificial material may assist in binding the conductive areas to the board, although the through via also still plays the main role of anchoring the conductive structure.

The laminated unit, including the interposer board and components, may be subjected to a thermal cycles at a temperature up to about 130° C. and down to room temperature by passing a current through a heater coil embedded within the product board.

EXAMPLE

Nickel arms were prepared in accordance with the flow process illustrated in FIG. 3, utilizing copper as the sacrificial material. Nickel arms of varying thicknesses, varying from 5 microns to 25 microns, usually with thirty arms prepared for each thickness or thickness range, were prepared. All of the arms were subjected to a mechanical bending test by pressing each arm from 10 to 15 microns with a probe until the arm contacted the board, and then permitting the arm to return, for 50 total presses. As summarized in Table 1, after 50 presses, all nickel arms thinner or equal to 15 microns bounced back to the original level when pressed down to the board and then freed. However, a few of the thicker nickel arms broke after exercising some thirty cycles. Both nickel arms that did break broke at the base of the cantilever, the manner of which was consistent with location of theoretical maximum stress. The step portion of the nickel arms was observed to be rather sturdy. The foremost observation of this set of probe tests is that all nickel arms bounced back like a spring.

TABLE 1

| Conductive Thickness | Bending Tests |
| --- | --- |
| 5 to 10 microns | All bounced after 50 cycles |
| 15 microns | All bounced after 50 cycles |
| 20 to 25 microns | Two broke at the $32^{nd}$ cycle |

It will be appreciated that various of the above-disclosed and other features and functions, or alternatives thereof, may be desirably combined into many other different systems or applications. Also, it will be appreciated that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A structure comprising:
   a circuit board having at least one conductive arm, wherein the conductive arm has an unconnected end located opposite to a connected end of the conductive arm that is connected to the circuit board, wherein the conductive arm has a front side and a back side located opposite to the front side of the conductive arm, wherein the backside of the conductive arm is located adjacent to the circuit board, and wherein the unconnected end of the conductive arm includes a dimple portion formed integrally with and as a unitary part of a remaining portion of the conductive arm, the dimple portion being out of plane with in plane portions of the connected end of the conductive arm so that the dimple portion is at a greater distance from the circuit board than the in plane portions of the conductive arm, the dimple portion being connected to the in plane portions of the conductive arm via an integrally formed and unitary riser portion, the riser portion being out of plane with the connected end of the conductive arm, and an air gap formed between the back side of the conductive arm at least at the dimple portion and the circuit board, permitting the conductive arm to flex into a space of the air gap.

2. The structure according to claim 1, wherein the conductive arm is comprised of nickel.

3. The structure according to claim 1, wherein the structure further includes a via through the circuit board, and wherein the connected end of the conductive arm is anchored to the circuit board by integral connection to conductive material deposited within the via.

4. The structure according to claim 1, wherein the structure has at least one of the conductive arms formed on opposite sides of the circuit board.

5. The structure according to claim 1, wherein the dimple portion further includes a contact material on the front side thereof.

6. The structure according to claim 1, wherein the conductive arm has a thickness from about 5 microns to about 15 microns.

7. The structure according to claim 1, wherein the air gap formed between the back side of the dimple portion of the conductive arm and the circuit board is about 15 microns to about 40 microns.

8. A structure comprising:
a printed circuit board including
a multiple layer electrical circuit board having at least one conductive arm, wherein the conductive arm has an unconnected end located opposite to a connected end of the conductive arm that is connected to the multiple layer electrical circuit board, wherein the conductive arm has a front side and a back side located opposite to the front side of the conductive arm, wherein the backside of the conductive arm is located adjacent to the multiple layer electrical circuit board, and wherein the unconnected end of the conductive arm includes a dimple portion formed integrally with and as a unitary part of a remaining portion of the conductive arm, wherein prior to connection to an ink jet printhead component, the dimple portion is out of plane with in plane portions of the connected end of the conductive arm so that the dimple portion is at a greater distance from the circuit board than the in plane portions of the conductive arm, the dimple portion being connected to the in plane portions of the conductive arm via an integrally formed and unitary riser portion, the riser portion being out of plane with the connected end of the conductive arm, and
an air gap formed between the back side of the conductive arm at least at the dimple portion and the multiple layer electrical circuit board, permitting the conductive arm to flex into the space of the air gap; and
an ink jet printhead component laminated to the printed circuit board, wherein following connection of the printed circuit board to the ink jet printhead component, the dimple portion contacts the component, the conductive arm is flexed into the air gap, and a restoring spring force is exerted by the conductive arm to maintain electrical contactivity between the dimple portion and the component.

9. The structure according to claim 8, wherein the conductive arm is comprised of nickel.

10. The structure according to claim 8, further comprising contact material applied at a contact point between the dimple portion of the conductive arm and the component.

11. The structure according to claim 10, further comprising an adhesive film laminated to the printed circuit board or to the component, wherein the adhesive film is translucent.

12. The structure according to claim 8, wherein the air gap formed between the back side of the dimple portion of the conductive arm and the electrical circuit board is about 15 microns to about 40 microns.

13. A method comprising:
forming a circuit board having at least one conductive arm, wherein the conductive arm has an unconnected end located opposite to a connected end of the conductive arm that is connected to the circuit board, wherein the conductive arm has a front side and a back side located opposite to the front side of the conductive arm, wherein the back side of the conductive arm is located adjacent to the circuit board, and wherein the unconnected end of the conductive arm includes a dimple portion formed integrally with and as a unitary part of a remaining portion of the conductive arm, the dimple portion being out of plane with in plane portions of the connected end of the conductive arm so that the dimple portion is at a greater distance from the circuit board than the in plane portions of the conductive arm, the dimple portion being connected to the in plane portions of the conductive arm via an integrally formed and unitary riser portion, the riser portion being out of plane with the connected end of the conductive arm, and an air gap formed between the back side of the conductive arm at least at the dimple portion and the circuit board, permitting the conductive arm to flex into the space of the air gap, the forming comprising
on a circuit board substrate, forming a sacrificial underlying layer including a bump of greater thickness than other portions of the sacrificial underlying layer, wherein the bump is located on the circuit board substrate where the dimple portion of the arm will be formed;
forming a via through the circuit board substrate;
patterning a resist onto portions of the sacrificial underlying layer not to have conductive plated thereon, the resist covering a portion of the bump;
plating a conductive layer onto the exposed portions of the sacrificial underlying layer and into the via;
removing the resist following the plating of the conductive layer; and
etching to remove at least a portion of the sacrificial underlying material located between the plated conductive layer and the circuit board substrate to form the unconnected end of the conductive arm and the air gap between the back side of the conductive arm and the circuit board substrate.

14. The method according to claim 13, wherein the etching is a two step etching, wherein a first stage etch removes portions of the sacrificial underlying layer exposed following the removal of the resist but does not remove portions of the sacrificial underlying layer covered by the conductive layer, and wherein a subsequent second stage etch removes at least the portion of the sacrificial underlying material located between the plated conductive layer that forms the unconnected end of the arm and the circuit board substrate.

15. The method according to claim 14, wherein following the first stage etch and prior to the second stage etch, the circuit board is evaluated for open circuits, short circuits, or both.

16. The method according to claim 13, wherein the sacrificial underlying material is a copper material.

17. The method according to claim 13, wherein the bump is formed by locating a bump pattern resist upon a sacrificial underlying material of substantially uniform thickness at a location where the bump is to be formed, etching the sacrificial underlying layer to reduce a thickness thereof at portions not covered by the bump pattern resist, and removing the bump pattern resist.

18. The method according to claim 17, wherein after removal of the bump pattern resist, the bump is further formed by plating of additional sacrificial underlying layer material.

19. The method according to claim 13, further comprising laminating the circuit board to an ink jet printhead component, wherein
    the front side of the bump portion of conductive arm contacts the component, and
    a restoring spring force of the conductive arm maintains electrical contactivity between the conductive arm and the component.

20. The method according to claim 19, further comprising heat tacking a translucent adhesive film to the circuit board or to the component.

21. The method according to claim 19, further comprising applying a contact material to a contact point where the front side of the dimple portion of the conductive arm contacts the component.

* * * * *